United States Patent [19]

Kobayashi et al.

[11] Patent Number: 5,668,019

[45] Date of Patent: Sep. 16, 1997

[54] METHOD OF FABRICATING THIN FILM TRANSISTOR

[75] Inventors: Kazuhiro Kobayashi; Hiroyuki Murai; Takao Sakamoto; Yuichi Masutani, all of Amagasaki, Japan

[73] Assignee: Mitsubishi Denki Kabushiki Kaisha, Tokyo, Japan

[21] Appl. No.: 94,954

[22] Filed: Jul. 23, 1993

Related U.S. Application Data

[63] Continuation-in-part of Ser. No. 38,651, Mar. 29, 1993, abandoned, which is a continuation-in-part of Ser. No. 9,141, Jan. 26, 1993, abandoned.

[30] Foreign Application Priority Data

Jan. 30, 1992 [JP] Japan ..................... 4-14770
Oct. 30, 1992 [JP] Japan ..................... 4-292692

[51] Int. Cl.[6] ............................................. H01L 21/84
[52] U.S. Cl. ............................... 438/163; 438/164
[58] Field of Search .......................... 156/625, 626; 437/228, 21, 41, 101, 44, 909

[56] References Cited

U.S. PATENT DOCUMENTS

| | | |
|---|---|---|
| 4,479,831 | 10/1984 | Sandow et al. |
| 4,577,391 | 3/1986 | Hsia et al. ........................ 29/571 |
| 4,629,859 | 12/1986 | Reddy ..................... 219/121 LM |
| 4,727,044 | 2/1988 | Yamazaki ........................ 437/45 |
| 4,751,169 | 6/1988 | Behringer et al. ............. 430/296 |
| 4,980,018 | 12/1990 | Mu et al. ....................... 156/643 |
| 5,214,295 | 5/1993 | Manning ........................ 437/41 |

FOREIGN PATENT DOCUMENTS

| | | | |
|---|---|---|---|
| 3935411A1 | 4/1990 | Germany ........................ 437/41 |
| 63-44767A | 2/1988 | Japan ........................ 437/40 |
| 63-211761A | 9/1988 | Japan ........................ 437/44 |
| 298142A | 4/1990 | Japan ........................ 437/41 |

OTHER PUBLICATIONS

Ghandhi, "VLSI Fabrication Principles Silicon and Gallium Arsenide", pp. 504–506. 1983, month unknown.
Wolf et al., "Silicon Processing for the VLSI Era", vol. I, pp. 544–547, 1986, month unknown.

*Primary Examiner*—John Niebling
*Assistant Examiner*—Richard A. Booth
*Attorney, Agent, or Firm*—Oblon, Spivak, McClelland, Maier & Neustadt, P.C.

[57] ABSTRACT

An Si thin film (2) for a channel is formed on an insulating substrate (1), and then a gate insulating film (3) made principally of $SiO_2$ is formed thereon. On the gate insulating film (3) is formed a gate electrode (4) composed of a Si thin film doped with impurities. The gate electrode (4) is patterned by isotropic etching using a photoresist (11) as a mask, and the gate insulating film (3) is patterned by anisotropic etching using the photoresist (11) as a mask into a configuration wider than the gate electrode (4) to be removed from source/drain regions position. The Si thin film (2) is ion implanted with impurities to form source/drain regions of an offset structure. A thin film transistor having an offset or LDD structure and capable of reducing an off-state drain current is fabricated without the need for increased number of masks and for an accurate photolithography technique, such as in alignment accuracy between masks.

13 Claims, 15 Drawing Sheets

METHOD OF FABRICATING THIN FILM TRANSISTOR

This application is a continuation-in-part of Ser. No. 08/038,651 filed Mar. 29, 1993, now abandoned which is a continuation-in-part of Ser. No. 08/009,141 filed Jan. 26, 1993, now abandoned.

BACKGROUND OF THE INVENTION

1. Field of the Invention

The present invention relates to a method of fabricating a thin film transistor to be used as a switch of an active matrix liquid crystal display and the like.

2. Description of the Background Art

FIG. 1H is a cross-sectional view of a conventional thin film transistor having an LDD (lightly doped drain) structure, which is fabricated through the process steps shown in FIGS. 1A to 1G. Such a thin film transistor is disclosed in, for example, Japanese Patent Publication No. 3-38755.

In FIG. 1H, reference numeral 1 designates an insulating substrate; 2 designates a Si thin film formed on the insulating substrate 1 and serving as a channel; 3 designates a gate insulating film formed on the Si thin film 2; and 4 designates a gate electrode formed on the gate insulating film 3. Reference numerals 5 designates lightly doped drain (LDD) regions doped with impurities such as phosphorus, boron or the like at a low concentration in the Si thin film 2; and 6 designates source/drain regions doped with impurities such as phosphorus, boron or the like at a high concentration in the Si thin film 2.

Reference numeral 7 designates a source electrode composed of a metal thin film; and 8 designates a drain electrode composed of a metal thin film. Reference numerals 9 designates contact holes for connecting the source and drain electrodes 7 and 8 to the source/drain regions 6.

Description will now be given hereinafter of a method of fabricating the thin film transistor of FIG. 1H with reference to FIGS. 1A to 1G.

The Si thin film 2 serving as a channel layer is initially formed on the insulating substrate 1, as shown in FIG. 1A. The gate insulating film 3 made of $SiO_2$ is formed in a thickness of 1400 Å, for example, by means of a thermal oxidation or sputtering technique, as shown in FIG. 1B. A phosphorus doped Si thin film is formed on the gate insulting film 3 and is then patterned to form the gate electrode 4, as shown in FIG. 1C. Using the gate electrode 4 as a mask, ion implantation is carried out with phosphorus at a low concentration to form the source/drain regions 5 in the Si thin film 2, as shown in FIG. 1D.

A pattern 10 that is wider than the gate electrode 4 is formed on the gate electrode 4, using a photoresist, as shown in FIG. 1E. Using the photoresist pattern 10 as a mask, the Si thin film 2 is ion implanted with phosphorus at a high concentration. This provides the LDD regions 5 doped with phosphorus at the low concentration and the source/drain regions 6 doped with phosphorus at the high concentration, as shown in FIG. 1F.

The contact holes 9 are formed in the gate insulating film 3, as shown in FIG. 1G. The source electrode 7 and the drain electrode 8 are simultaneously formed through the contact holes 9, as shown in FIG. 1H. This completes the thin film transistor having the LDD structure.

If the low concentration ion implantation of FIG. 1D is not executed, the regions 5 in FIG. 1H become an intentionally undoped region, to thereby achieve a thin film transistor having an offset structure, as shown in FIG. 2.

In operation, variation in a voltage applied across the source and gate electrodes 7 and 4, with a voltage applied across the source and drain electrodes 7 and 8, enables a drain current flowing between the source and drain electrodes 7 and 8 to vary. Thus, the thin film transistor of FIG. 1H may be used as a switching element.

For using the thin film transistor as a switching element of an active matrix liquid crystal display, an off-state resistance of the thin film transistor is required to be at least not less than the resistance of a liquid crystal element. This necessitates reduction in the off-state drain current of the transistor.

In particular, when a polycrystalline Si film is used as the Si thin film 2 for channel formation in order to increase an on-state drain current, a field enhanced emission current flows due to the presence of grain boundaries in the polycrystalline Si film, resulting in an increase in the off-state drain current. The off-state drain current is generally believed to be proportional to the number of dangling bonds in grain boundary and to an electric field strength in the vicinity of the drain.

For the purpose of reducing the electric field strength in the vicinity of the drain, the LDD regions 5 doped at the low impurity concentration are formed in the transistor of FIG. 1H, to increase the width of a depletion layer formed between the Si thin film 2 and the source/drain regions 6. As a result, the LDD structure capable of reducing the off-state drain current is achieved.

The conventional thin film transistor having the LDD structure has required two photolithography process steps in order to separately make the low impurity concentration regions 5 and the high impurity concentration regions 6. As the length of the low impurity concentration regions 5 grows large, the resistance elements of the regions 5 increase, resulting in disadvantageous reduction in the on-state drain current of the thin film transistor. Preventing this necessitates an alignment accuracy between the gate electrode 4 and the resist 10 in FIG. 1E. In particular, as the impurity concentration of the regions 5 doped at the low concentration is reduced for reducing the off-state drain current, the resistance elements of the low impurity concentration regions 5 increase to cause the reduction in the on-state drain current. Therefore an improvement is required in alignment accuracy between the gate electrode 4 and the resist 10.

Another approach is to make an offset structure in which impurities are not introduced intentionally into the low impurity concentration regions 5 to reduce the on-state drain current, as shown in FIG. 2. This attempt, however, increases the resistance of the channel region 2, which decreases the on-state drain current without accurate control of the channel length. However, accurate exposure has been quite difficult. A large-sized device such as a liquid crystal display including a display portion having a diagonal line over several inches in length has not met the foregoing demands because there is no exposing device capable of large area exposure and having a high alignment accuracy.

SUMMARY OF THE INVENTION

The present invention is intended for a method of fabricating a thin film transistor with an offset LDD structure.

According to the first aspect of the present invention, the method comprises the steps of: preparing an insulating substrate; forming a first Si thin film serving as a channel layer on the insulating substrate; forming a gate insulating film made principally of SiO$_2$ on the first Si thin film; forming a second Si thin film doped with an impurity on the gate insulating film; patterning the second Si thin film by isotropic etching using a photoresist as a mask to form a gate electrode that is narrower than the photoresist, patterning the gate insulating film by anisotropic etching using the photoresist as a mask into a configuration that is wider than a pattern width of the gate electrode to form a gate insulating film pattern; and ion implanting the first Si thin film with an impurity using the gate insulating film pattern as mask to form source/drain regions of an offset structure.

In the second aspect of the present invention, the method comprises the steps of: preparing an insulating substrate; forming a first Si thin film serving as a channel layer on the insulating substrate; forming a gate insulating film made principally of SiO$_2$ on the first Si thin film; forming a second Si thin film doped with an impurity on the gate insulating film; patterning the second Si thin film by isotropic etching using a photoresist as a mask to form a gate electrode that is narrower than the photoresist; patterning the gate insulating film by anisotropic etching using the photoresist as a mask into a configuration that is wider than a pattern width of the gate electrode to form a gate insulating film pattern; ion implanting the first Si thin film with a first impurity of a conductivity type at a high concentration with an accelerating voltage that is low enough so that the first impurity does not sufficiently pass through the gate insulting film pattern; and ion implanting the first Si thin film with a second impurity of said conductivity type at a low concentration with an accelerating voltage that is high enough so that the second impurity sufficiently passes through the gate insulating film pattern to form LDD regions of an LDD structure.

In the third aspect of the present invention, the method comprises the steps of: preparing an insulating substrate; forming a first Si thin film serving as a channel layer on the insulating substrate; forming a gate insulating film made principally of SiO$_2$ on the first Si thin film; forming a second Si thin film doped with an impurity on the gate insulating film; patterning the second Si thin film by isotropic etching using a photoresist as a mask to form a gate electrode that is narrower than the photoresist; patterning the gate insulating film by anisotropic etching using the photoresist as a mask into a configuration that is wider than a pattern width of the gate electrode to form a gate insulating film pattern; ion implanting the first Si thin film with a first impurity of a conductivity type at a high concentration using the gate insulating film pattern as a mask; etching off the gate insulating film pattern on both ends of the gate electrode; and ion implanting the first Si thin film with a second impurity of said conductivity type at a low concentration using the gate electrode and the gate insulating film pattern as a mask to form LDD regions of an LDD structure.

In the fourth aspect of the present invention, the method comprises the steps of: preparing an insulating substrate; forming a first Si thin film serving as a channel layer on the insulating substrate; forming a gate insulating film made principally of SiO$_2$ on the first Si thin film; forming a second Si thin film doped with an impurity on the gate insulating film; patterning the second Si thin film by isotropic etching using a photoresist as a mask to form a gate electrode that is narrower than the photoresist; and ion implanting the first Si thin film with an impurity through the gate insulating film using the photoresist as a mask to form source/drain regions of an offset structure.

In the fifth aspect of the present invention, the method comprises the steps of: preparing an insulating substrate; forming a first Si thin film serving as a channel layer on the insulating substrate; forming a gate insulating film made principally of SiO$_2$ on the first Si thin film; forming a second Si thin film doped with an impurity on the gate insulating film; patterning the second Si thin film by isotropic etching using a photoresist as a mask to form a gate electrode that is narrower than the photoresist; ion implanting the first Si thin film with a first impurity of a conductivity type at a high concentration through the gate insulating film using the photoresist as a mask; removing the photoresist; and ion implanting the first Si thin film with a second impurity of said conductivity type at a low concentration through the gate insulating film using the gate electrode as a mask to form LDD regions of an LDD structure.

In the sixth aspect of the present invention, the method comprises the steps of: preparing an insulating substrate; forming a first Si thin film serving as a channel layer on the insulating substrate; forming a gate insulating film made principally of SiO$_2$ on the first Si thin film; forming a second Si thin film doped with an impurity on the gate insulating film; patterning the second Si thin film by isotropic etching using a photoresist as a mask to form a gate electrode that is narrower than the photoresist; ion implanting the first Si thin film with a first impurity of a predetermined conductivity type at a high concentration through the gate insulating film using the photoresist as a mask; removing the photoresist; patterning the gate insulating film using the gate electrode as a mask; and ion implanting the first Si thin film with a second impurity of the predetermined conductivity type at a low concentration using the gate electrode and the gate insulating film as a mask to form LDD regions of an LDD structure.

According to the first and second aspects of the present invention, the gate insulating film is patterned into a configuration that is wider than the pattern width of the gate electrode to be removed from the source/drain regions. This eliminates the necessity of increasing the number of masks and of high accuracy mask alignment. The offset or LDD structure is provided by the ion implantation into the source/drain regions, resulting in the off-state drain current being reduced.

According to the third aspect of the present invention, a high accelerating voltage is not required for the ion implantation at the high concentration.

According to the fourth aspect of the present invention, the isotropic etching is carried out for the formation of the pattern of the gate electrode so that the formed gate electrode is narrower than the photoresist. The ion implantation is carried out using the same photoresist as a mask. This provides the offset structure without the necessity of increasing the number of masks and of high accuracy mask alignment, resulting in the off-state drain current being reduced.

According to the fifth and sixth aspects of the present invention, the gate electrode is formed so as to be narrower than the photoresist. The ion implantation with impurities at the high concentration is carried out using the same photoresist as a mask. After the removal of the photoresist, the ion implantation with impurities at the low concentration is carried out using the gate electrode as a mask. This provides the LDD structure without the necessity of increasing the number of masks and of high accuracy mask alignment, and with the off-state drain current being reduced.

Accordingly, an object of the present invention is to provide a method of fabricating a thin film transistor having an offset or LDD structure capable of weakening an electric field strength in the vicinity of a drain to reduce an off-state drain current, without particular needs for increase in the number of masks and an improvement in an alignment accuracy between the masks.

These and other objects, features, aspects and advantages of the present invention will become more apparent from the following detailed description of the present invention when taken in conjunction with the accompanying drawings.

DESCRIPTION OF THE PREFERRED EMBODIMENTS

Preferred embodiments according to the present invention will be described hereinafter.

First Preferred Embodiment

FIGS. 3A to 3G are cross-sectional views showing process steps of a method of fabricating a thin film transistor of an offset structure according to a first preferred embodiment of the present invention.

Figure 1A:
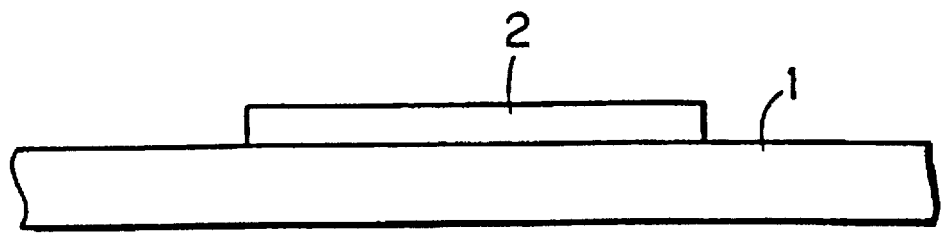
FIGS. 1A to 1H are cross-sectional views showing process steps of a method of fabricating a conventional thin film transistor having an LDD structure.
Figure 1B:
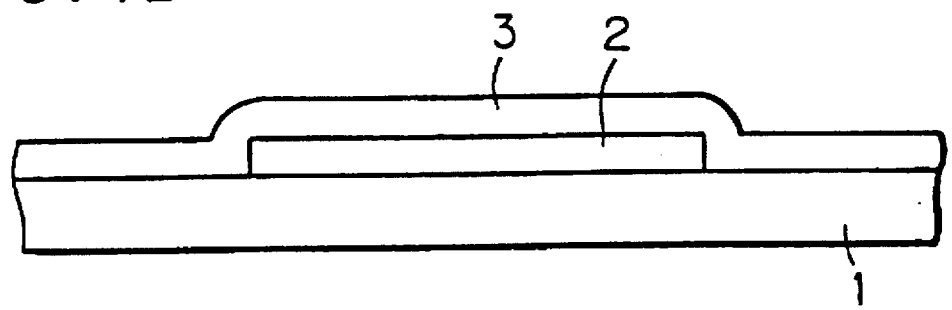
Figure 1C:
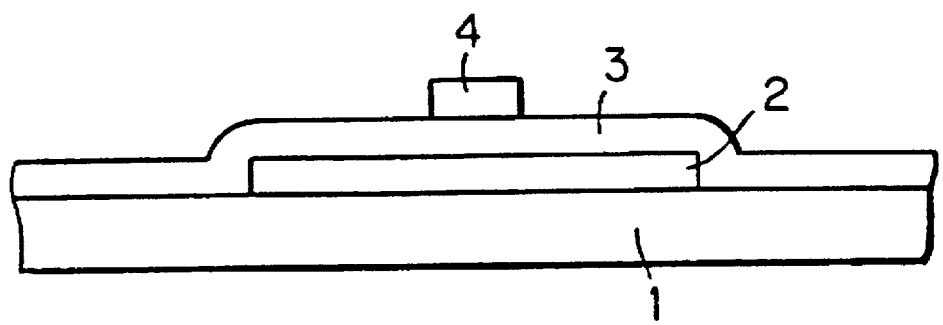
Figure 1D:
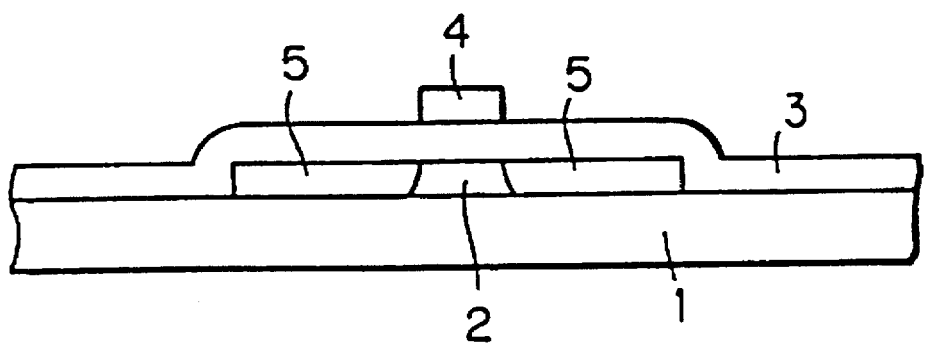
Figure 1E:
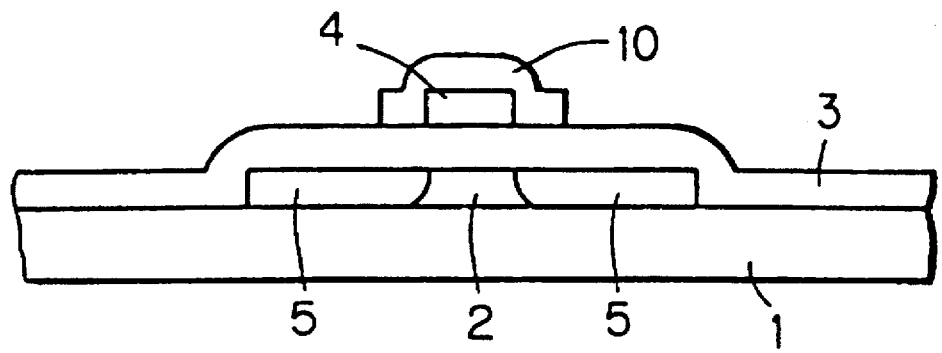
Figure 1F:
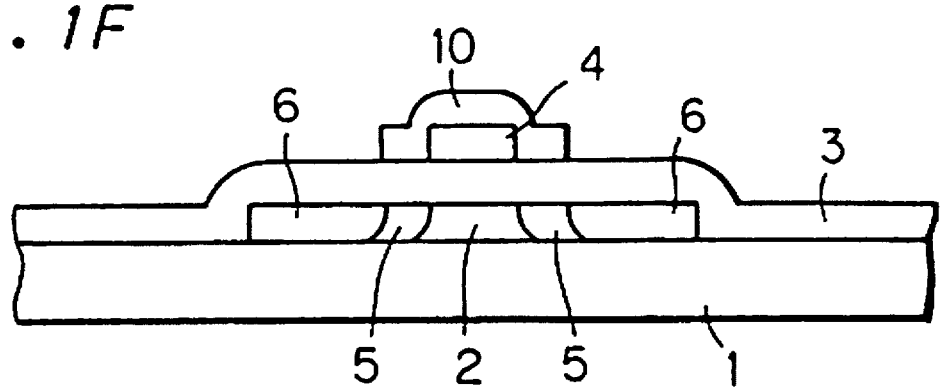
Figure 1G:
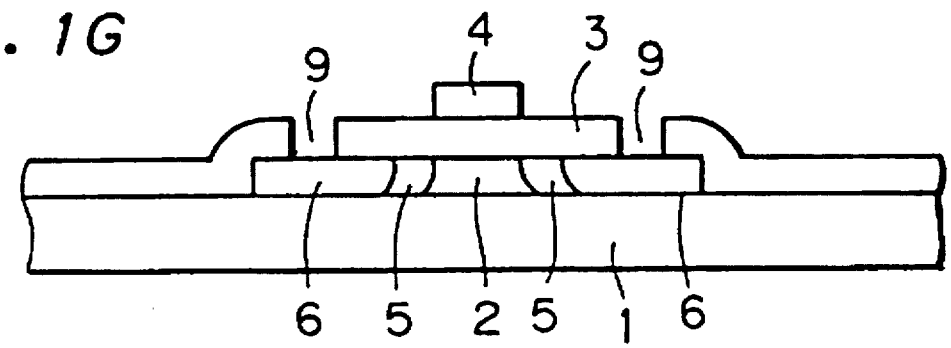
Figure 1H:
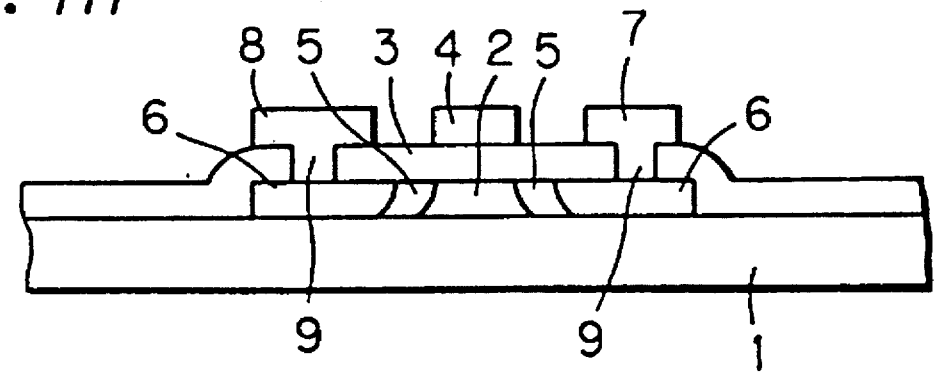
Figure 2:
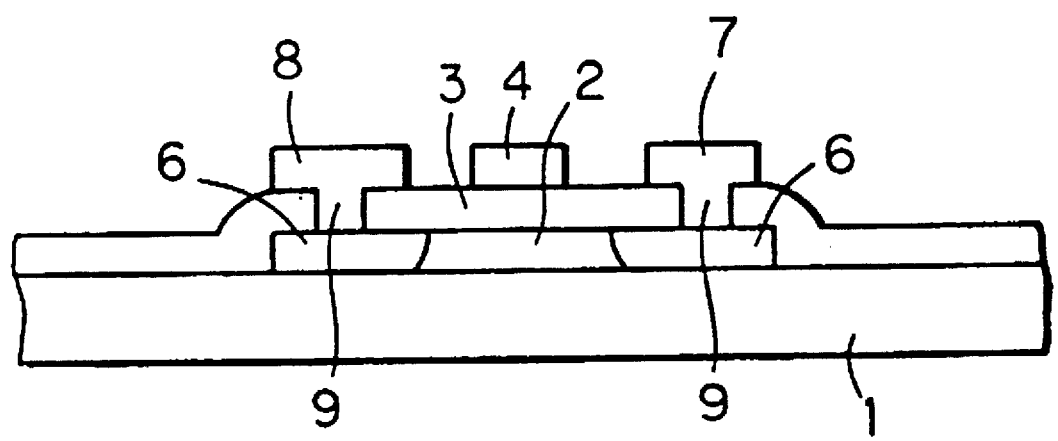
FIG. 2 is a cross-sectional view showing a conventional thin film transistor having an offset structure.
Figure 3A:
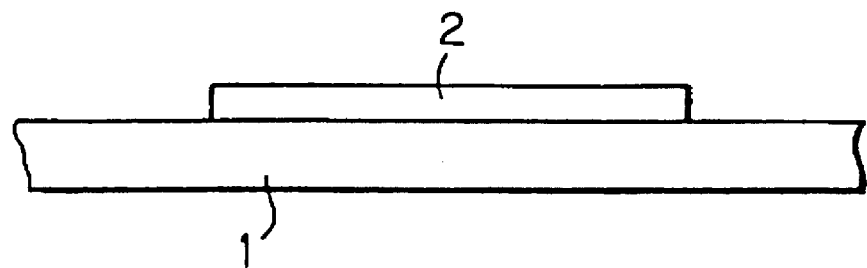
FIGS. 3A to 3G are cross-sectional views showing process steps of a method of fabricating a thin film transistor having an offset structure according to a first preferred embodiment of the present invention.
Figure 3B:
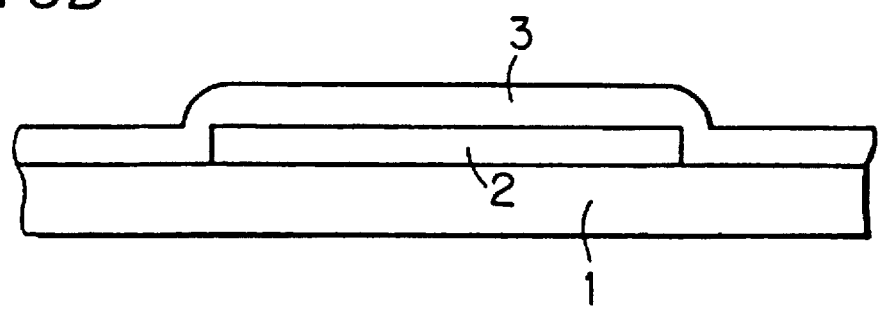
Figure 3C:
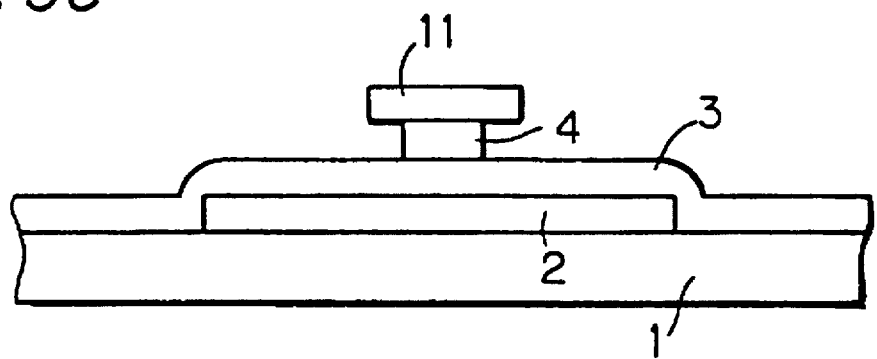
Figure 3D:
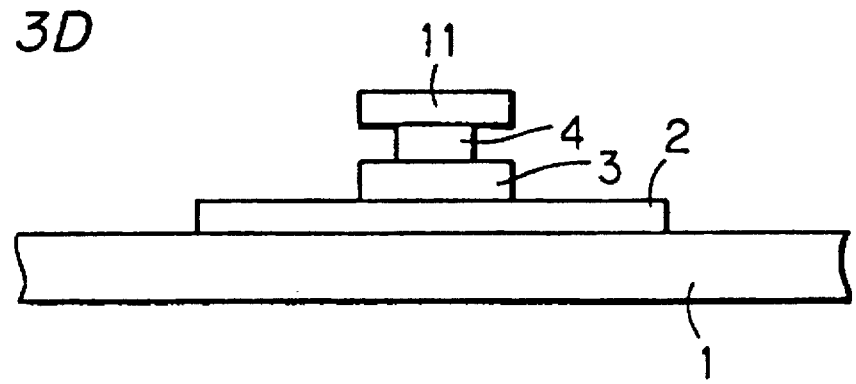
Figure 3E:
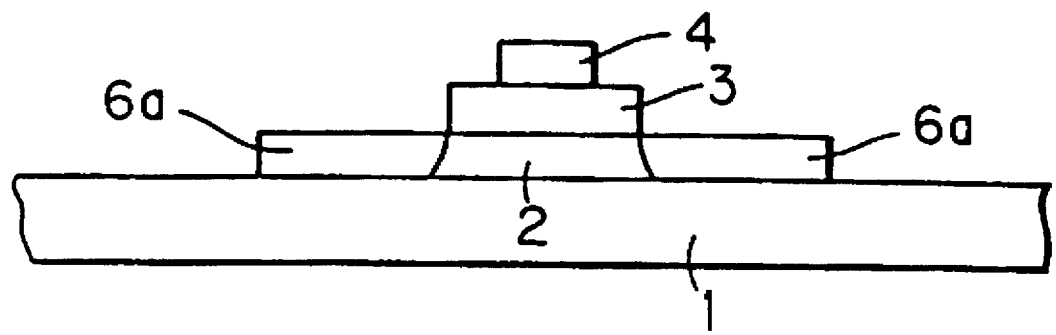
Figure 3F:
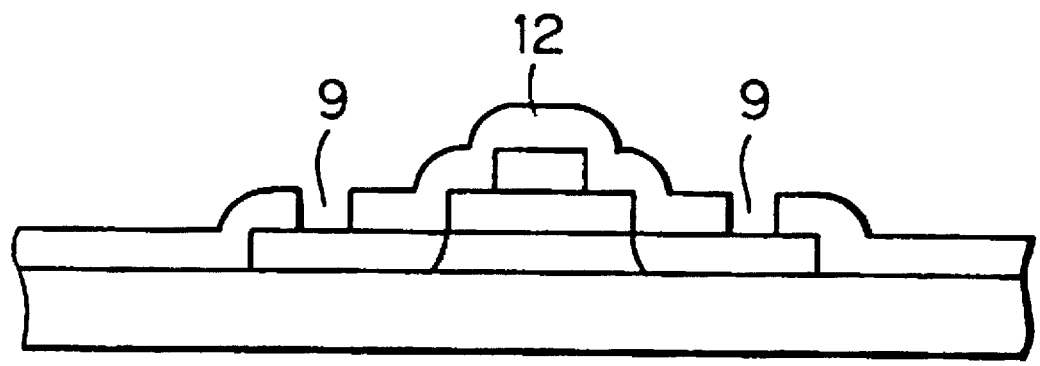
Figure 3G:
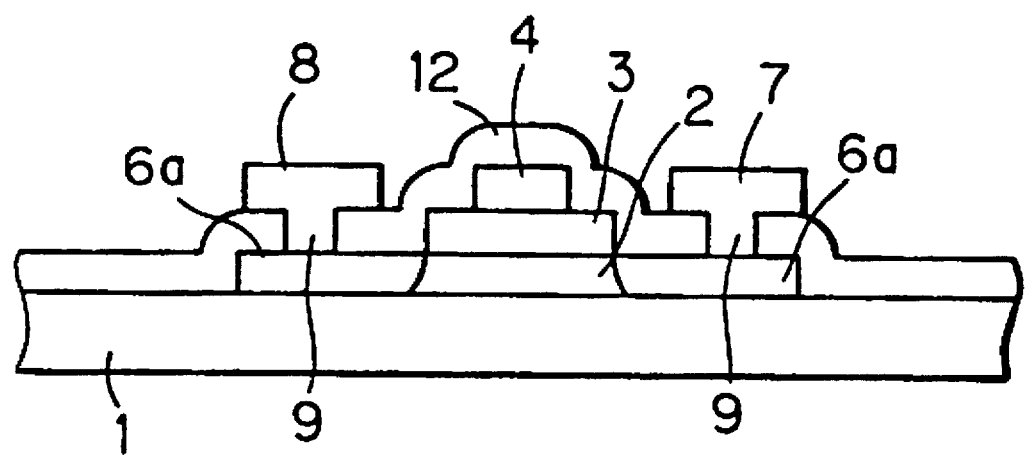

Referring to FIG. 3G showing the final step, the structure of the thin film transistor will be discussed below. An Si thin film 2 serving as a channel is formed on an insulating substrate 1, and a gate insulating film 3 is formed on the Si thin film 2. In turn, a gate electrode 4 is formed on the gate insulating film 3.

Source/drain regions 6a are provided by doping the Si thin film 2 with impurities such as phosphorus, boron or the like at a high concentration. Contact holes 9 are formed in a passivation film 12. A source electrode 7 and a drain electrode 8 are formed in the contact holes 9 to contact the source/drain regions 6a. The source and drain electrodes 7 and 8 are composed of a metal thin film.

Description will now be given on a method of fabricating the thin film transistor of the first preferred embodiment. The Si thin film 2 as a channel layer is formed on the insulating substrate 1, as shown in FIG. 3A. The gate insulating film 3 made of $SiO_2$ is formed in a thickness of about 1400 Å, for example, by means of a thermal oxidation or sputtering technique, as shown in FIG. 3B.

Figure 13:
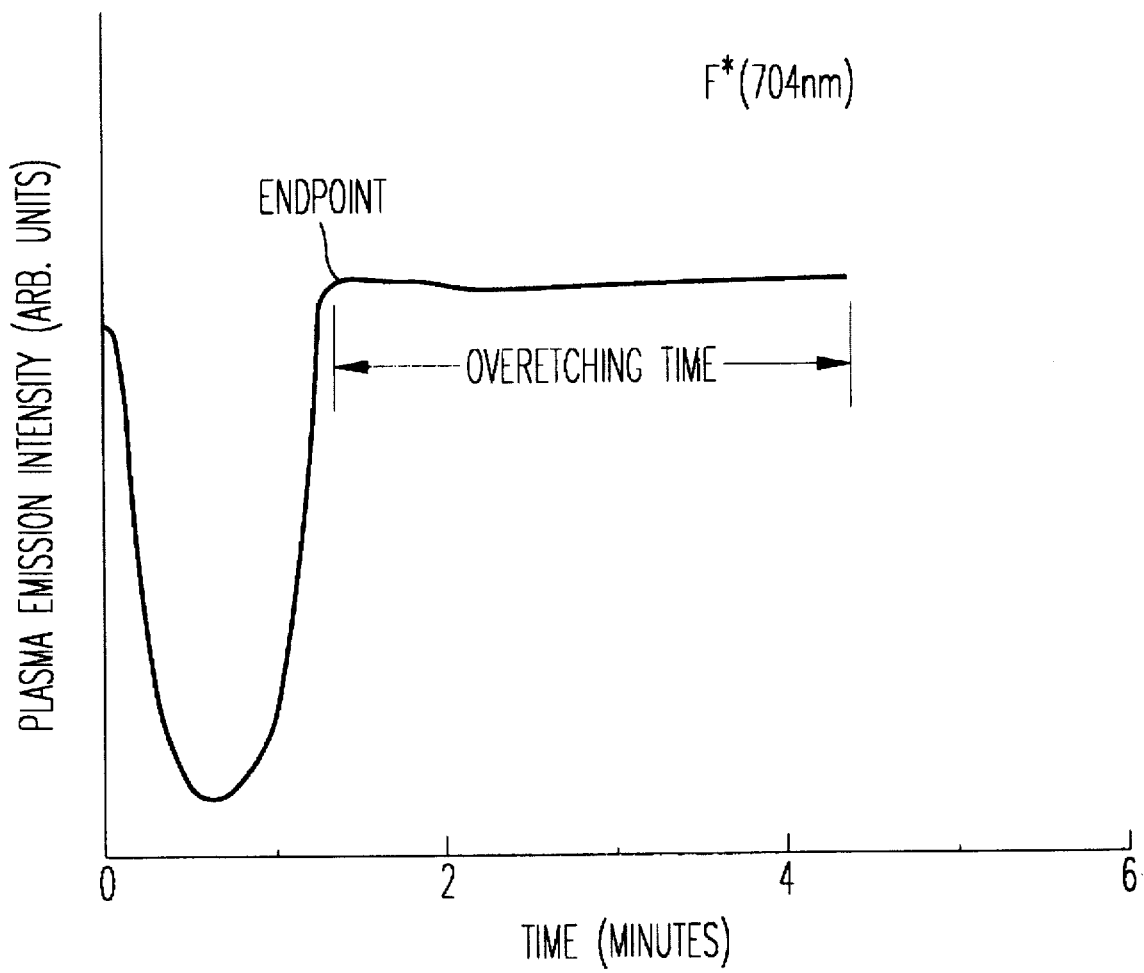
FIGS. 13 and 14 show the overetching time and the corresponding distance of overetching.
Figure 14:
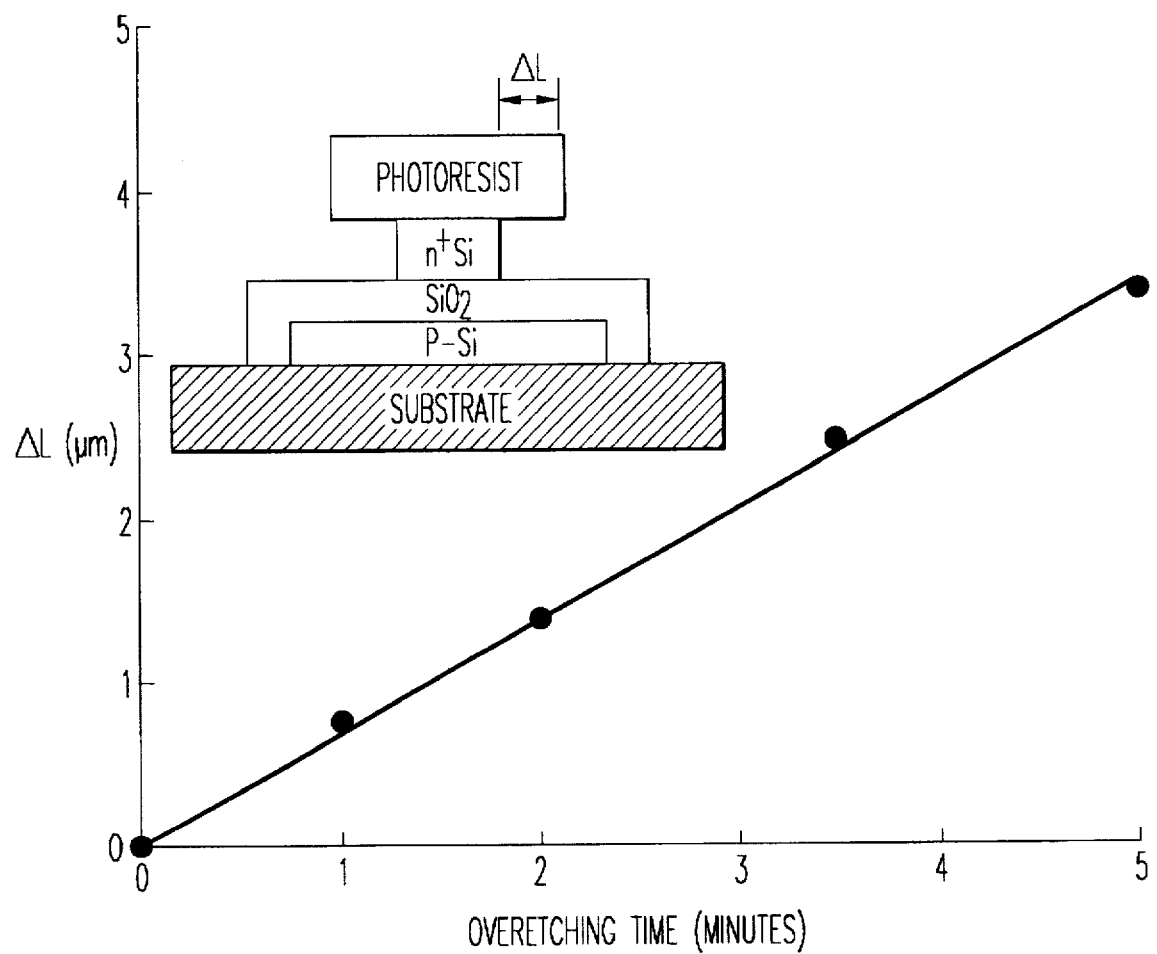

On the gate insulating film 3 is formed a Si thin film doped, for example, with phosphorus in a thickness of about 1500 Å, as shown in FIG. 3C. Using a photoresist 11 as a mask, the Si thin film is dry etched in plasma, for example, using an $SF_6$ gas and is then patterned to provide the gate electrode 4. The $SF_6$ gas provides an isotropic etching. Etching of the gate electrode 4 is accompanied by a certain amount of side etching. An additional dry etching after the end of the dry etching of the gate electrode 4 causes the lateral side etching to further proceed. Under the etching conditions that a radio-frequency electric power is 0.08 $W/cm^2$ and a gas pressure is 40 mTorr using $SF_6$, for example, an additional etching for about 45 seconds after the end of the dry etching of the gate electrode 4 is accompanied by the side etching of 0.5 μm on opposite sides of the gate electrode under the photoresist. Plasma emission in a dry etching system is utilized for detection of a dry etching endpoint of the gate electrode 4 and control of an additional etching time. Observing the plasma emission in the system during the dry etching using plasma spectrometry, it is found that the plasma emission intensity of fluorine radical ($F^*$) of 704 nm wavelength varies as shown in FIG. 13. Referring to FIG. 13, the $F^*$ emission intensity decreases initially, because the $F^*$ separated from the $SF_6$ gas by plasma reacts with Si of the gate electrode 4 and is consumed so that the $F^*$ concentration in plasma decreases. On completion of the etching of the gate electrode 4, the $F^*$ emission intensity increases and then becomes constant. This point is the endpoint at which the etching of the gate electrode 4 is finished. An additional etching to be performed from the endpoint on is referred to as an overetching, and the time period for the additional etching is referred to as an overetching time. As the overetching time increases, the side etching proceeds and a side etching length ΔL increase linearly as shown in FIG. 14. The side etching length ΔL is an offset length or an LDD length. The use of the plasma emission permits precise control of the side etching length ΔL and, accordingly, precise control of the offset length or LDD length to any value, thereby achieving improvements in reproducibility of TFT characteristics.

Doped amorphous Si may be used as a material for the Si thin film which is to later serve as the gate electrode 4. In which case, the amorphous Si thin film is dry-etched using $SF_6$ and then annealed for recrystallization, whereby the gate electrode 4 made of polysilicon Si is obtained. This approach is advantageous in that the amorphous Si thin film is etched into a smoother configuration while etched using $SF_6$.

Then the gate insulating film 3 is dry etched using a $CHF_3$ gas, as shown in FIG. 3D, under the dry etching conditions that a radio-frequency electric power is 0.25 $W/cm^2$ and a pressure is 40 mTorr. Since the dry etching using the $CHF_3$ gas is anisotropic, the gate insulating film 3 is etched into the same pattern as the photoresist 11 on the gate electrode 4. On completion of the etching of the gate insulating film 3, the gate electrode 4 of doped Si film is structured such that the end thereof is positioned about 0.5 μm inwardly of the end of the gate insulating film 3.

As shown in FIG. 3E, the photoresist 11 is removed, and then the Si thin film 2 is ion implanted, for example, with phosphorus at a high concentration using the gate electrode 4 and the gate insulating film 3 as a mask. The accelerating voltage of the ion implantation is set to a voltage which does not permit phosphorus to pass through the gate insulating film 3. This ion implantation provides the source/drain regions 6a doped with phosphorous at the high concentration in a region on which the gate insulating film 3 made of SiO$_2$ is absent, the other region of the Si thin film 2 not being ion implanted with impurities.

The passivation film 12 is formed, and then the contact holes 9 are formed therein, as shown in FIG. 3F. The source electrode 7 and the drain electrode 8 are simultaneously formed, as shown in FIG. 3G. Thus the thin film transistor having an offset structure is achieved.

The operation of the above-mentioned thin film transistor will be discussed below. Variation in a voltage applied across the source and gate electrodes 7 and 4, with a voltage applied across the source and drain electrodes 7 and 8, enables a drain current flowing between the source and drain electrodes 7 and 8 to vary. Thus, the thin film transistor of FIG. 3G may be used as a switching element.

For using the thin film transistor as a switching element of an active matrix liquid crystal display, an off-state resistance of the thin film transistor is required to be not less than the resistance of a liquid crystal element, in order to provide ion off-state drain current of the thin film transistor. However, when polycrystalline Si film is used as the Si thin film 2 for channel formation in order to increase an on-state drain current, a field enhanced emission current flows due to the presence of grain boundary in the polycrystalline Si film and results in a disadvantageous increase in the off-state drain current.

The off-state drain current is generally said to be proportional to the number of dangling bonds in the grain boundaries and to an electric field strength in the vicinity of the drain. It is important to reduce the electric field strength in the vicinity of the drain for reduction in the off-state drain current. The thin film transistor of FIG. 3G, which has the offset structure at its channel end, enables the reduction in the electric field strength in the vicinity of the drain and, accordingly, the reduction in the off-state drain current.

Furthermore, the photoresist 11 may be used for etching of both the gate electrode 4 and the gate insulating film 3. This eliminates the necessity for increase in the number of masks and high accuracy mask alignment.

Second Preferred Embodiment

Figure 4:
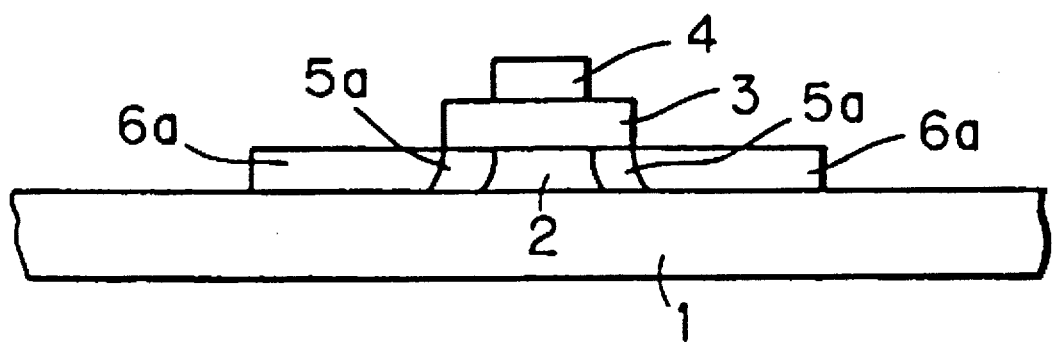
FIG. 4 and FIG. 5 are cross-sectional views with respect to a thin film transistor having an LDD structure according to a second preferred embodiment of the present invention.
Figure 5:
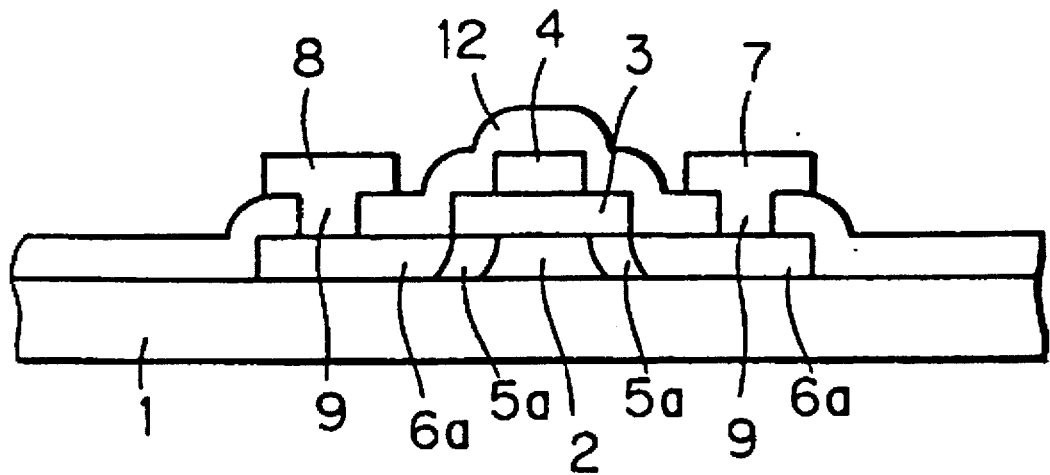

In the first preferred embodiment, the accelerating voltage of the ion implantation for the formation of the source/drain regions 6a is adapted to be not more than the voltage which prevents phosphorus from passing through the gate insulating film 3. However, in the second preferred embodiment, a thin film transistor having an LDD structure, which includes regions 5a doped at a low concentration, as shown in FIG. 5, may be fabricated by using the steps of ion implanting the Si thin film 2 with phosphorus or the like at a high concentration with an accelerating voltage that is not more than the voltage which prevents phosphorus from passing through the gate insulating film 3 to form the source/drain regions 6a, as shown in FIG. 3E, and further ion implanting the Si thin film 2 with phosphorus or the like at a low concentration with an accelerating voltage high enough to permit phosphorus to pass through the gate insulating film 3 to form the lightly doped regions 5a, as shown in FIG. 4. Other steps are the same as in the first embodiment. This doping contributes to the reduction in the off-state drain current with little reduction in the on-state drain current.

Third Preferred Embodiment

Figure 6A:
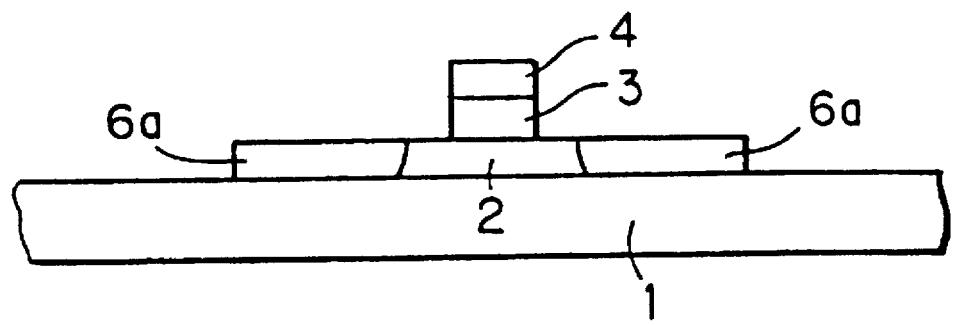
FIGS. 6A and 6B and FIG. 7 are cross-sectional views with respect to the thin film transistor having an LDD structure according to a third preferred embodiment of the present invention.
Figure 6B:
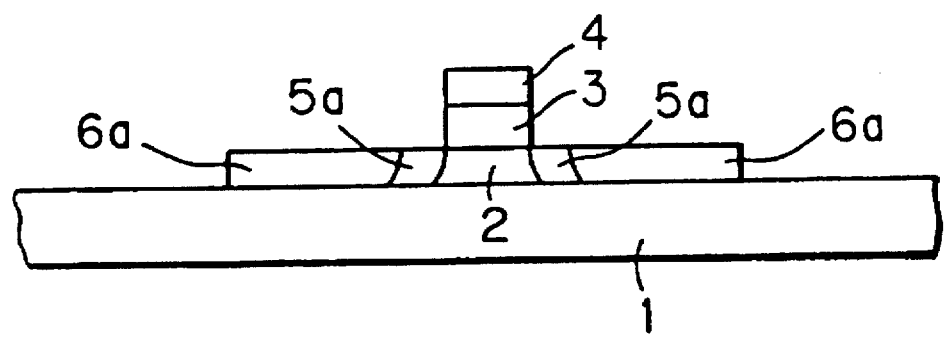
Figure 7:
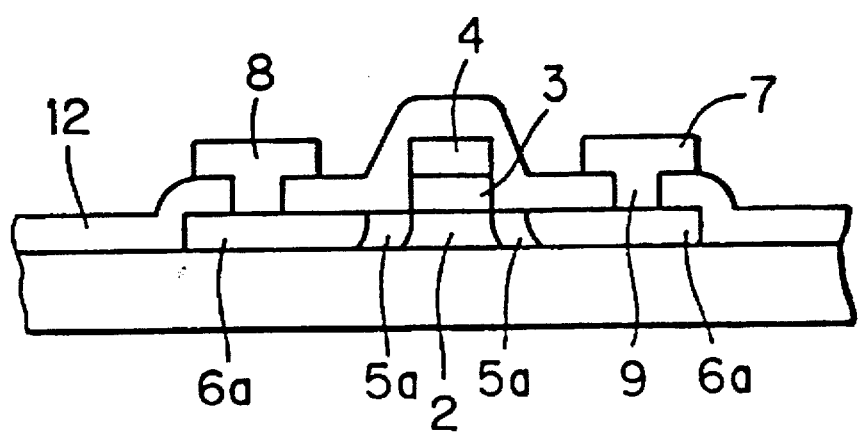

To achieve the LDD structure, the gate insulting film 3 is left wider than both ends of the gate electrode 4 and the accelerating voltage of the ion implantation is changed in the two ion implanting steps in the second preferred embodiment. On the other hand, in the third embodiment, the thin film transistor of the LDD structure of FIG. 7 can be fabricated by using the steps of, after the ion implantation at the high concentration shown in FIG. 3E, etching the gate insulating film 3 on both ends of the gate electrode 4 as shown in FIG. 6A by immersion in an etchant, which does not etch doped Si which is used as the gate electrode 4, but which etches SiO$_2$, which is used as the gate insulating film 3. For example, buffered hydrofluoric acid may be used as the etchant. Then, executing ion implantation at a low concentration to form lightly doped regions 5a is performed as shown in FIG. 6B. This eliminates the requirement of the high accelerating voltage of the second preferred embodiment.

Although the SF$_6$ gas is used to etch the gate electrode 4 in the first to third preferred embodiments, a gas may be used which is made principally of Cl$_2$, NF$_3$, CF$_4$ or the like to accomplish isotropic dry etching. Although the CHF$_3$ gas is used to etch the gate insulating film 3, a gas may be used which is made principally of CF$_4$, CF$_3$Cl, CF$_2$Cl$_2$, C$_2$F$_6$, C$_2$F$_5$Cl, C$_2$F$_4$Cl$_2$, C$_3$F$_8$ or the like to accomplish anisotropic dry etching.

Fourth Preferred Embodiment

Figure 8A:
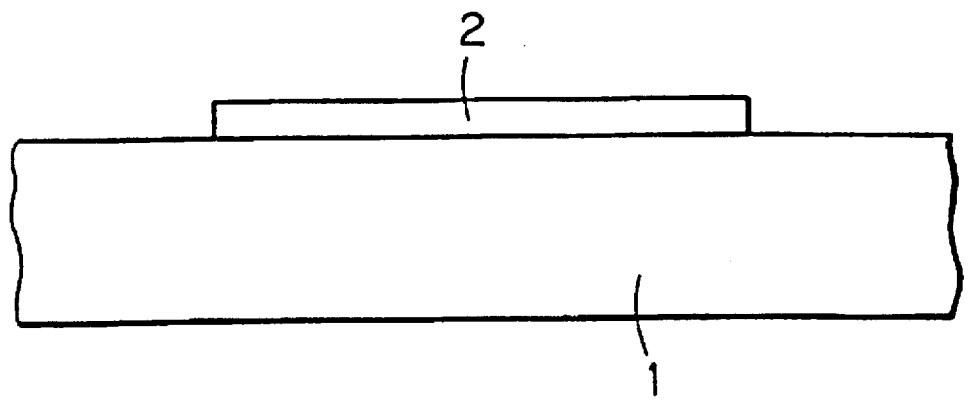
FIGS. 8A to 8F are cross-sectional views showing process steps of a method of fabricating the thin film transistor having an offset structure according to a fourth preferred embodiment of the present invention.
Figure 8B:
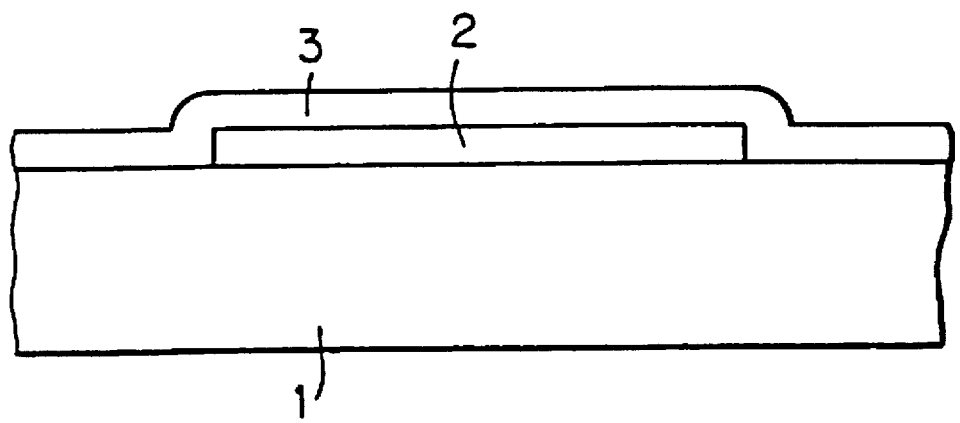
Figure 8C:
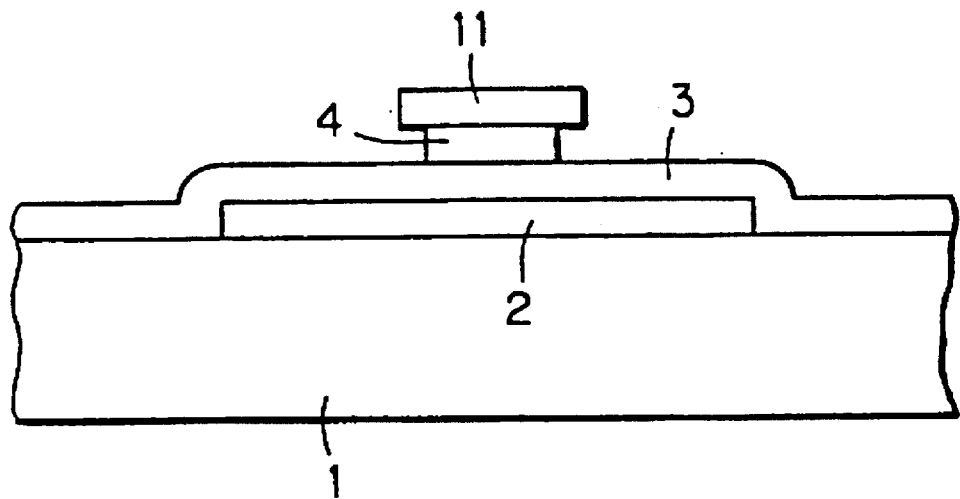

FIGS. 8A to 8F are cross-sectional views showing process steps of a method of fabricating a thin film transistor having an offset structure according to a fourth preferred embodiment of the present invention. The Si thin film 2 serving as the channel layer is formed on the insulating substrate 1, as shown in FIG. 8A. The gate insulating film 3 made of SiO$_2$ is formed in a thickness of about 1400 Å, for example, by means of the thermal oxidation or sputtering technique, as shown in FIG. 8B. As shown in FIG. 8C, a Si thin film doped, for example, with phosphorus is formed in a thickness of 1500 Å on the gate insulating film 3. Using the photoresist 11 as a mask, the Si film on the gate insulating film 3 is dry etched in plasma, for example, using the SF$_6$ gas and is then patterned to form the gate electrode 4. The SF$_6$ gas provides the isotropic etching. Etching of the gate electrode 4 is accompanied by a certain amount of side etching. An additional dry etching after the end of the dry etching of the gate electrode 4 causes the lateral side etching to further proceed. Under the etching conditions that a radio-frequency electric power is 0.08 W/cm$^2$ and a gas pressure is 40 mTorr using SF$_6$, for example, an additional etching for about 45 seconds after the end of the dry etching of the gate electrode 4 is accompanied by the side etching of 0.5 μm on opposite sides of the gate electrode under the photoresist. Plasma emission in a dry etching system is utilized for detection of a dry etching endpoint of the gate electrode 4 and control of an additional etching time. Observing the plasma emission in the system during the dry etching using plasma spectrometry, it is found that the plasma emission intensity of fluorine radical (F*) of 704 nm wavelength varies as shown in FIG. 13. Referring to FIG. 13, the F* emission intensity decreases initially, because the F* separated from the SF$_6$ gas by the plasma reacts with Si of the gate electrode 4 and is consumed so that the F* concentration in the plasma decreases. On completion of the etching of the gate electrode 4, the F* emission intensity increases and then becomes constant. This point is the endpoint at which the etching of the gate electrode 4 is finished. An additional etching to be performed from the endpoint on is referred to as an overetching, and the time period for the additional etching is referred to as an overetching time.

As the overetching time increases, the side etching proceeds and a side etching length ΔL increase linearly as shown in FIG. 14. The side etching length ΔL is an offset length or an LDD length. The use of the plasma emission permits precise control of the side etching length ΔL and, accordingly, precise control of the offset length or LDD length to any value, thereby achieving improvements in reproducibility of TFT characteristics.

Figure 8D:
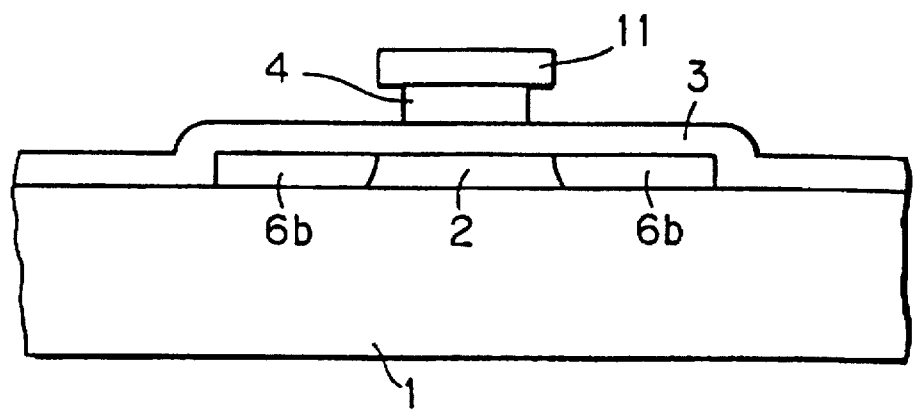

The Si thin film 2 is ion implanted with phosphorus, using the photoresist 11 left unremoved as a mask, as shown in FIG. 8D. Since the photoresist 11 is a little wider than the gate electrode 4, the Si thin film 2 in a range wider than the gate electrode 4 is not ion implanted. This ion implantation provides the source/drain regions 6b doped at a high concentration.

Figure 8E:
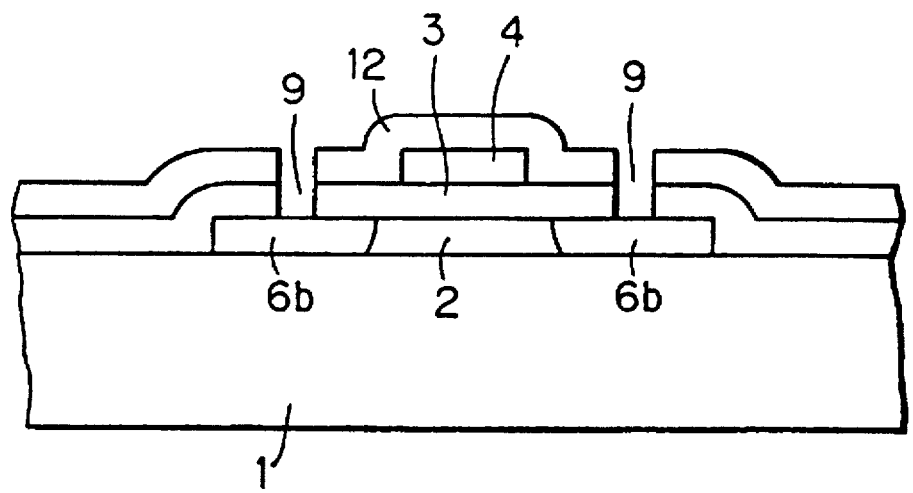
Figure 8F:
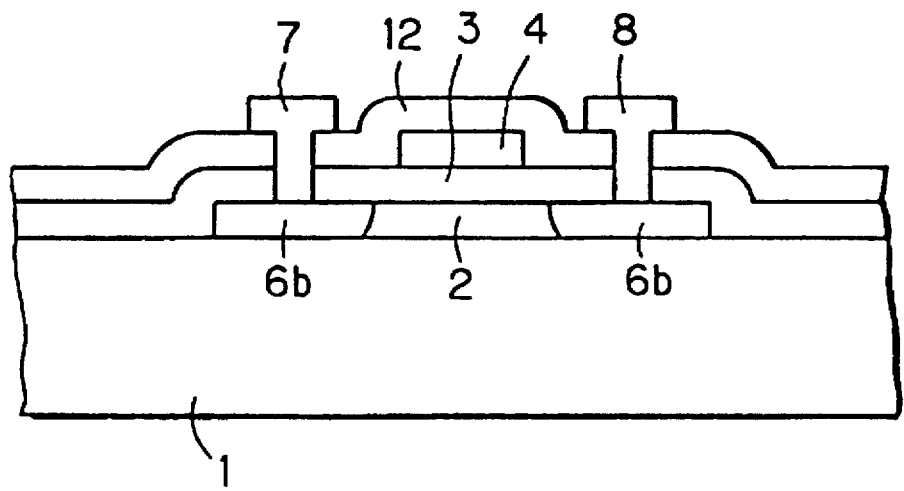

The photoresist 11 is removed, and the passivation film 12 is formed. The contact holes 9 are opened, as shown in FIG. 8E. The source electrode 7 and drain electrode 8 composed of a metal thin film are simultaneously formed, as shown in FIG. 8F. Thus the thin film transistor of the offset structure is formed. The operation of the fourth preferred embodiment is identical with that of the first preferred embodiment, and the description thereof will be omitted.

Fifth Preferred Embodiment

Figure 9A:
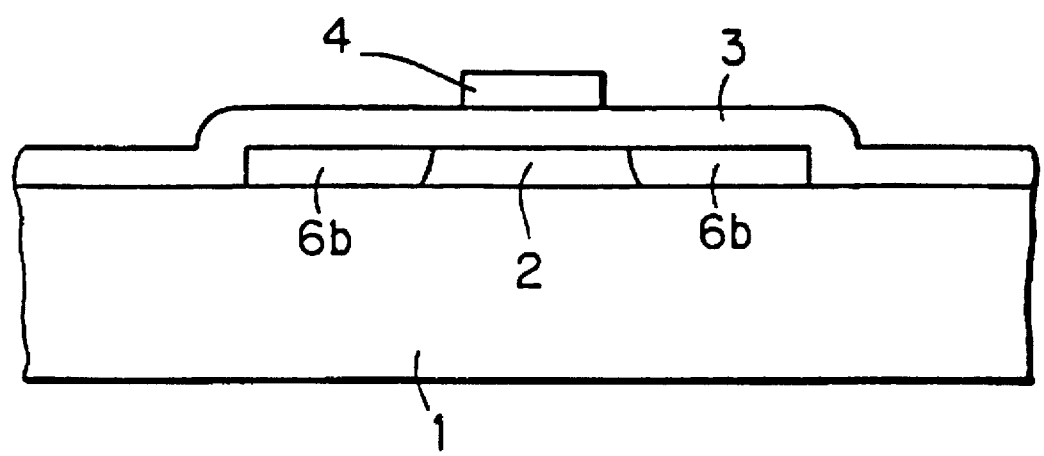
FIGS. 9A and 9B and FIG. 10 are cross-sectional views with respect to the thin film transistor having an LDD structure according to a fifth preferred embodiment of the present invention.
Figure 9B:
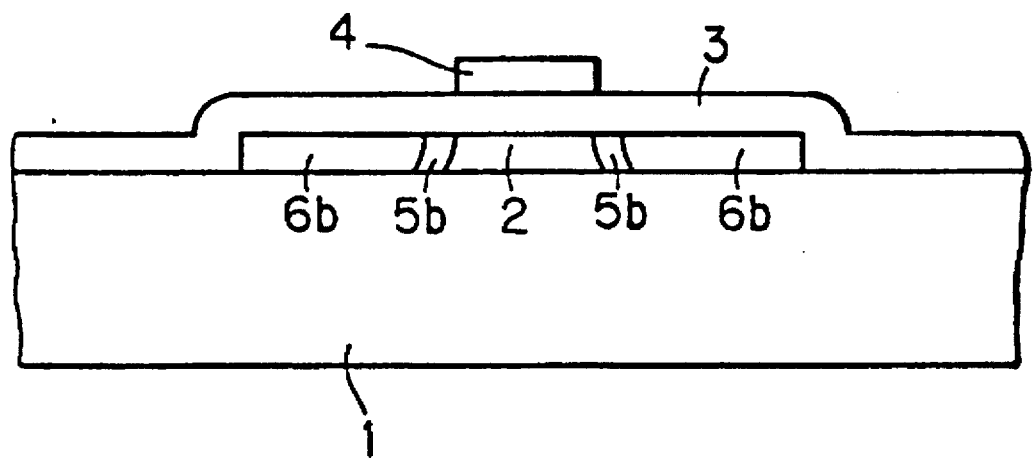
Figure 10:
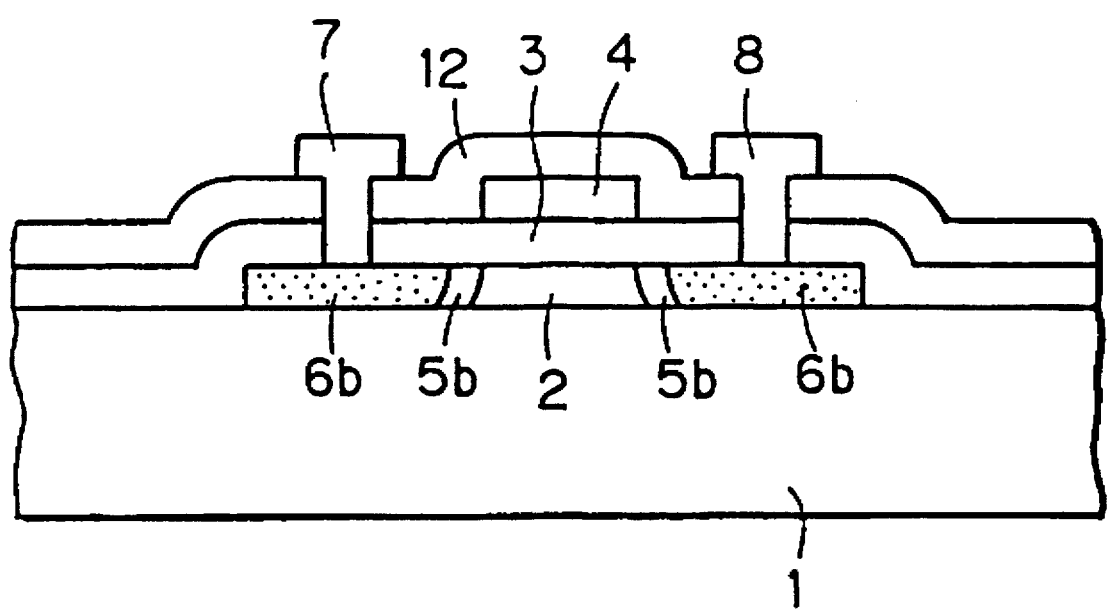

Although the thin film transistor of the offset structure is discussed in the fourth preferred embodiment, a thin film transistor of the LDD structure which includes regions 5b doped at low concentration as shown in FIG. 10 may be fabricated by using the steps of, after the ion implantation in FIG. 8D for the formation of the source/drain regions 6b, removing the photoresist 11 as shown in FIG. 9A and ion implanting the Si thin film 2 with phosphorus at a low concentration, using the gate electrode 4 as a mask to form the lightly doped regions 5b as shown in FIG. 9B. The thin film transistor of the fifth preferred embodiment achieves the reduction in the off-state drain current thereof. The introduction of the implanted impurities into the gate insulating film 3 under the gate electrode 4 can be prevented in the second ion implantation step by making the gate electrode 4 thicker than the gate insulating film 3.

Sixth Preferred Embodiment

Figure 11A:
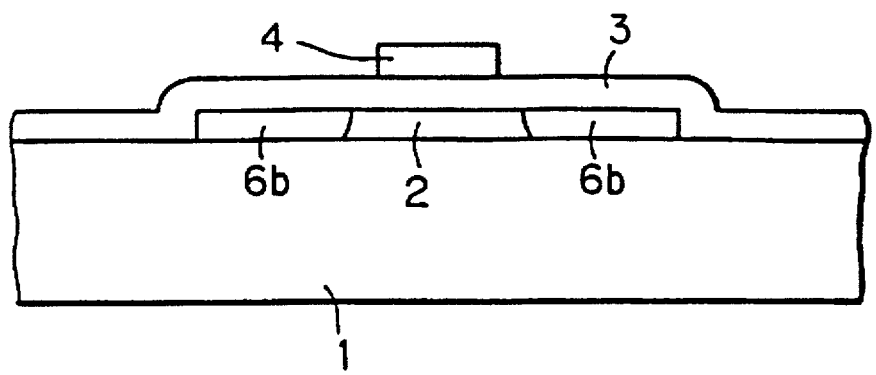
FIGS. 11A to 11C and FIG. 12 are cross-sectional views with respect to the thin film transistor having an LDD structure according to a sixth preferred embodiment of the present invention.
Figure 11B:
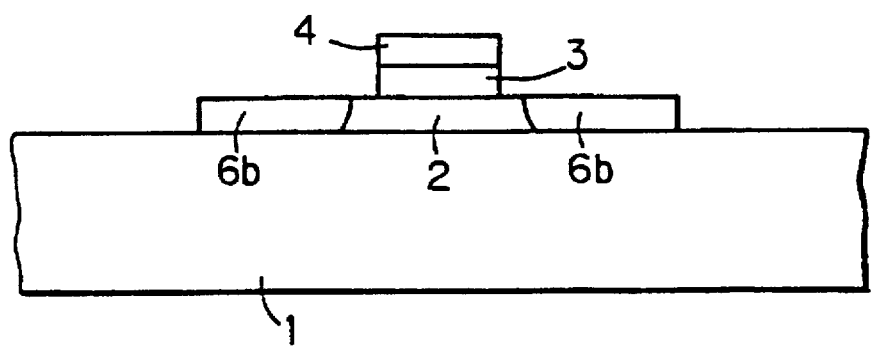
Figure 11C:
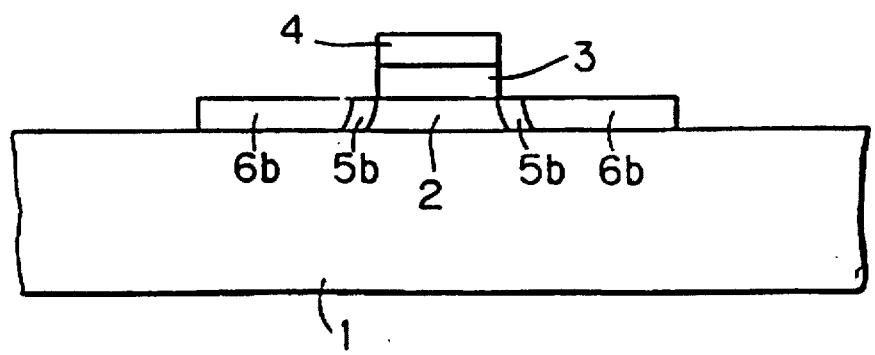
Figure 12:
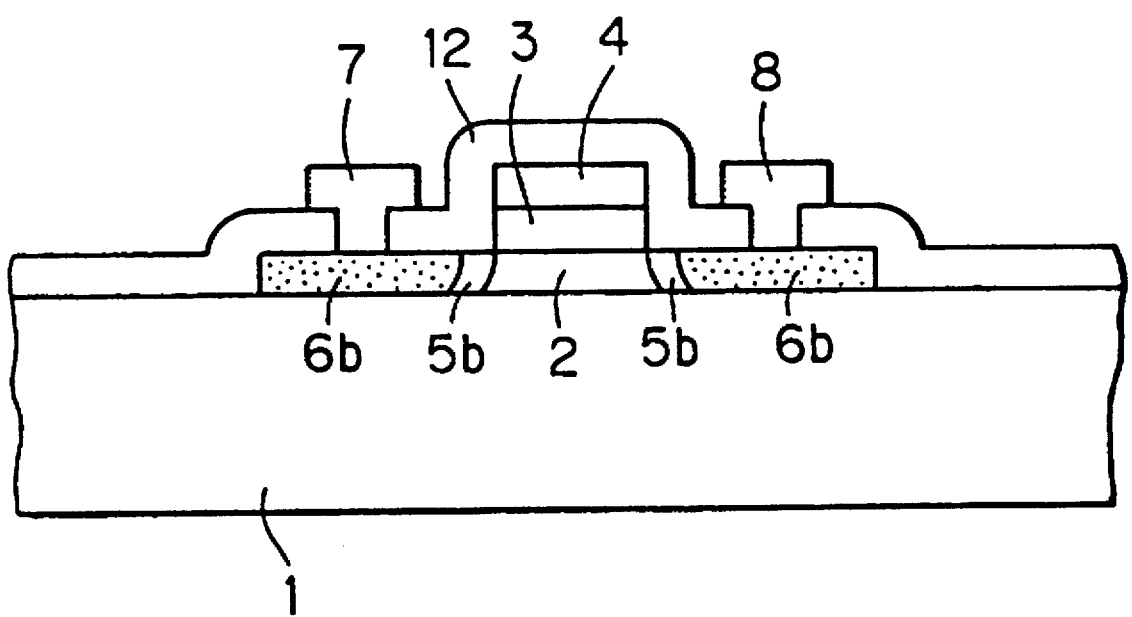

It is necessary in the fifth preferred embodiment to make the gate electrode 4 thicker than the gate insulting film 3 since the second ion implantation step is carried out with the gate insulating film 3 on the source-drain region 6b left unremoved. The thin film transistor of the LDD structure of FIG. 12 may be provided without thickening the gate electrode 4 by using the steps of, after the first ion implantation step of FIG. 8D, removing the photoresist 11 as shown in FIG. 11A, etching off the gate insulating film 3 protruding from the gate electrode 4 as shown in FIG. 11B by immersion in an etchant such as buffered hydrofluoric acid. That etchant does not etch doped Si which is used as the gate electrode 4, but etches the SiO₂ that is used as the gate insulating film 3. Then, the second ion implantation is executed to form the lightly doped regions 5b as shown in FIG. 11C.

Although the SF₆ gas is used to etch the gate electrode 4 in the fourth to sixth preferred embodiments, a gas may be used which is made principally of Cl₂, NF₃, CF₄ or the like to accomplish isotropic dry etching.

While the invention has been shown and described in detail, the foregoing description is in all aspects illustrative and not restrictive. It is therefore understood that numerous modifications and variations can be devised without departing from the scope of the invention.

What is claimed is:

1. A method of fabricating a thin film transistor, comprising the steps of:
   preparing an insulating substrate;
   forming a first Si film serving as a channel layer on said insulating substrate;
   forming a gate insulating film made principally of SiO₂ on said first Si film;
   forming a second Si film doped with an impurity on said gate insulating film;
   patterning said second Si film by isotropic etching using a photoresist layer as a mask to form a gate electrode that is narrower than the photoresist layer;
   patterning said gate insulating film by anisotropic etching using said photoresist layer as a mask into a configuration that is wider than said gate electrode to form a gate insulating film pattern; and
   ion implanting said first Si film with an impurity using said gate insulating film pattern as a mask to form source/drain regions of an offset structure.

2. A method of fabricating a thin film transistor, comprising the steps of:
   preparing an insulating substrate;
   forming a first Si film serving as a channel layer on said insulating substrate;
   forming a gate insulating film made principally of SiO₂ on said first Si film;
   forming a second Si film doped with an impurity on said gate insulating film;
   patterning said second Si film by isotropic etching using a photoresist layer as a mask to form a gate electrode that is narrower than the photoresist layer;
   patterning said gate insulating film by anisotropic etching using said photoresist layer as a mask into a configuration that is wider than said gate electrode to form a gate insulating film pattern;
   ion implanting said first Si film with first impurities of a conductivity type to a first concentration with an accelerating voltage that is low enough so that said first impurities do not pass through said gate insulting film pattern; and
   ion implanting said first Si film with second impurities of said conductivity type to a second concentration that is less than said first concentration with an accelerating voltage that is high enough so that said second impurities pass through said gate insulating film pattern to form source/drain regions of an LDD structure.

3. A method of fabricating a thin film transistor, comprising the steps of:
   preparing an insulating substrate;
   forming a first Si film serving as a channel layer on said insulating substrate;
   forming a gate insulating film made principally of SiO₂ on said first Si film;
   forming a second Si film doped with an impurity on said gate insulating film;
   patterning said second Si film by isotropic etching using a photoresist layer as a mask to form a gate electrode that is narrower than the photoresist layer;
   patterning said gate insulating film by anisotropic etching using said photoresist layer as a mask into a configuration that is wider than said gate electrode to form a gate insulating film pattern; and
   ion implanting said first Si film with first impurities of a conductivity type at a high concentration using said gate insulating film pattern as a mask;

etching off said gate insulating film pattern on both ends of said gate electrode; and ion implanting said first Si film with second impurities of said conductivity type at a low concentration using said gate electrode and said gate insulating film pattern as a mask to form source/drain regions of an LDD structure.

4. A method of fabricating a thin film transistor, comprising the steps of:

preparing an insulating substrate;

forming a first Si film serving as a channel layer on said insulating substrate;

forming a gate insulating film made principally of $SiO_2$ on said first Si film;

forming a second Si film doped with an impurity on said gate insulating film;

patterning said second Si film by isotropic etching using a photoresist layer as a mask to form a gate electrode narrower than said photoresist layer;

ion implanting said first Si film with first impurities of a conductivity type at a high concentration through said gate insulating film using said photoresist layer as a mask;

removing said photoresist layer;

patterning said gate insulating film using said gate electrode as a mask; and ion implanting said first Si film with second impurities of said conductivity type at a low concentration using said gate electrode and said gate insulating film as a mask to form source/drain regions of an LDD structure.

5. A method of fabricating a thin film transistor in accordance with any one of claims 1–3 and 4, wherein:

said isotropic etching during said step of patterning said second Si film is attained by dry etching using a gas primarily consisting of at least one compound of the group consisting of at least one of $SF_6$, $CF_4$, $Cl_2$, or $NF_3$.

6. A method of fabricating a thin film transistor in accordance with any one of claims 1–3, wherein: p1 said isotropic etching during said step of patterning said gate insulating film is attained by dry etching using a gas primarily consisting of one compound from the group consisting of $CHF_3$, $CF_4$, $CF_3Cl_1$, $CF_2Cl_2$, $C_2F_6$, $C_2F_2Cl$, $C_2F_4Cl_2$, and $C_3F_8$.

7. A method of fabricating a thin film transistor in accordance with any one of claims 1–3 and 4, wherein:

said second Si film is an amorphous Si film, and said method further comprising the step of annealing said second Si film to polycrystallize said second Si film after said step of patterning said second Si film.

8. A method of fabricating a thin film transistor in accordance with claim 5, wherein:

the end point of said dry etching is detected by means of plasma spectrometry and an overetching is performed over the endpoint, to thereby control an offset length or an LDD length on opposite sides of said gate electrode.

9. A method of fabricating a thin film transistor in accordance with claim 5, wherein:

the etching is performed using a gas consisting primarily of $SF_6$ and utilizing plasma emission of fluorine radical ($F^*$) as an index of detection of an etching end point.

10. A method of fabricating a thin film transistor, comprising the steps of:

preparing an insulating substrate;

forming a first silicon film, serving as a channel layer, on said insulating substrate;

forming a gate insulating film made principally of $SiO_2$ on said first silicon film;

forming a second silicon film that is doped with impurities on said gate insulating film;

patterning said second silicon film by isotropic etching, using a photoresist layer as a mask, to form a gate electrode that is narrower than said photoresist layer, and then;

ion implanting said first silicon film with first impurities of a conductivity type through said gate insulating film, using said photoresist layer as a mask, to form source/drain regions of an offset structure; and wherein said isotropic etching during said step of patterning said second silicon film comprises dry etching said second silicon film using a gas consisting primarily of $SF_6$.

11. A method of fabricating a thin film transistor, comprising the steps of:

preparing an insulating substrate;

forming a first silicon film, serving as a channel layer, on said insulating substrate;

forming a gate insulating film made principally of $SiO_2$ on said first silicon film;

forming a second silicon film that is doped with impurities, on said gate isulating film;

patterning said second silicon film by isotropic etching, using a photoresist layer as a mask, to form a gate electrode that is narrower than said photoresist layer, and then;

ion implanting said first silicon film through said gate insulating film, using said photoresist layer as a mask, with first impurities of a conductivity type to a first concentration;

removing said photoresist layer;

ion implanting said first silicon film through said gate insulating film, using said gate electrode as a mask to form source/drain regions of an LDD structure, with second impurities of said conductivity type to a second concentration that is less than said first concentration; and wherein said isotropic etching during the step of patterning said second silicon film comprises dry etching using a gas primarily consisting of $SF_6$.

12. A method according to one of claims 10 and 11, wherein:

the endpoint of said dry etching is detected by means of plasma spectrometry and an overetching is performed over the endpoint, to thereby control an offset length or an LDD length on opposite sides of said gate electrode.

13. A method according to any one of claims 10 and 11, wherein:

the etching is performed using a gas consisting primarily of $SF_6$ and utilizing plasma emission of fluorine radical ($F^*$) as an index of detection of an etching endpoint.

* * * * *